United States Patent

Nobori et al.

[11] Patent Number: 5,869,848
[45] Date of Patent: *Feb. 9, 1999

[54] END FACE LIGHT-EMITTING-TYPE LED, END FACE LIGHT-EMITTING-TYPE LED ARRAY AND METHODS OF MANUFACTURING THEM

[75] Inventors: Masaharu Nobori; Hiroyuki Fujiwara; Masumi Koizumi; Aya Yamanaka; Makoto Ishimaru; Yukio Nakamura, all of Tokyo, Japan

[73] Assignee: Oki Electric Industry Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 762,417

[22] Filed: Dec. 9, 1996

[30] Foreign Application Priority Data

Dec. 14, 1995 [JP] Japan ..................................... 7-325918
Nov. 27, 1996 [JP] Japan ..................................... 8-315873

[51] Int. Cl.$^6$ ..................................................... N01L 33/00
[52] U.S. Cl. .................................................. 257/95; 257/98
[58] Field of Search .................................. 257/95, 98

[56] References Cited

U.S. PATENT DOCUMENTS 5,260,588  11/1993  Ohta et al. ................................ 257/95

FOREIGN PATENT DOCUMENTS 57-75473   5/1982   Japan.
57-79482   5/1982   Japan.
2-125765   5/1990   Japan.

OTHER PUBLICATIONS

Dyment et al, "Top and Side Emisson From Double Heterostructure . . . " IEEE Trans on ED vol. ED–24 No. 7, Jul. 1977.

Primary Examiner—Stephen D. Meier
Attorney, Agent, or Firm—Jones & Volentine, L.L.P.

[57] ABSTRACT

An end face light-emitting-type LED has a first-conductive-type semiconductor substrate and a second-conductive-type diffusion region formed on a first surface of the first-conductive-type semiconductor substrate so as to have a depth within a predetermined value. The first-conductive-type semiconductor substrate has a second surface which meets the first surface at a predetermined angle with the first surface. A junction between the first-conductive-type semiconductor substrate and the second-conductive-type diffusion region includes an inclined portion with regard to the first surface in the vicinity of an edge portion of the junction which is on a side of the second surface, and light emerges from the junction via the second surface.

20 Claims, 16 Drawing Sheets

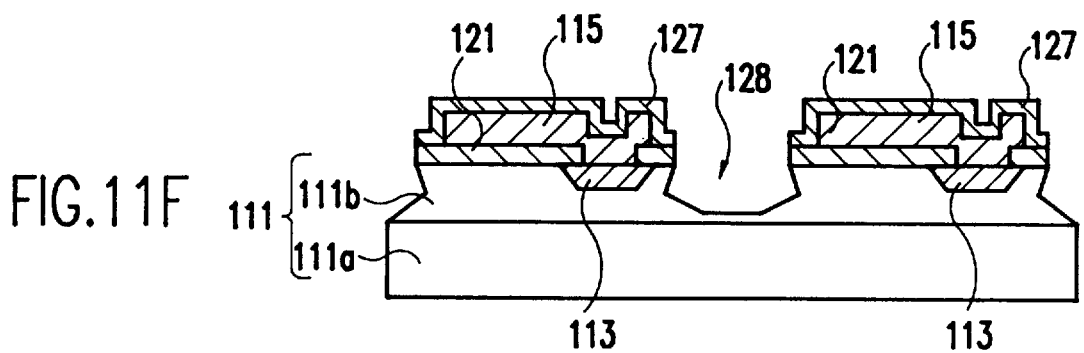
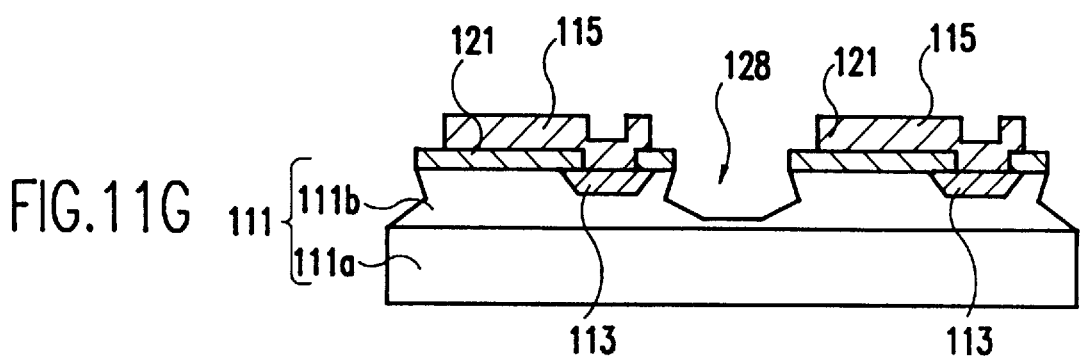
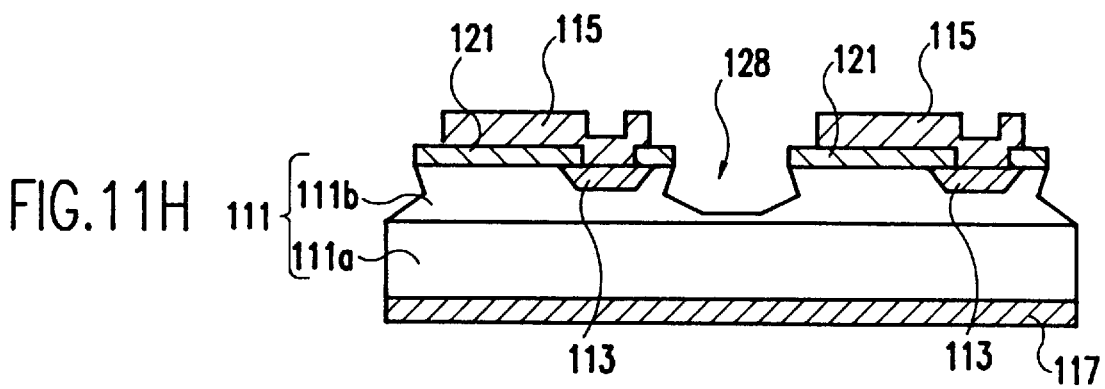
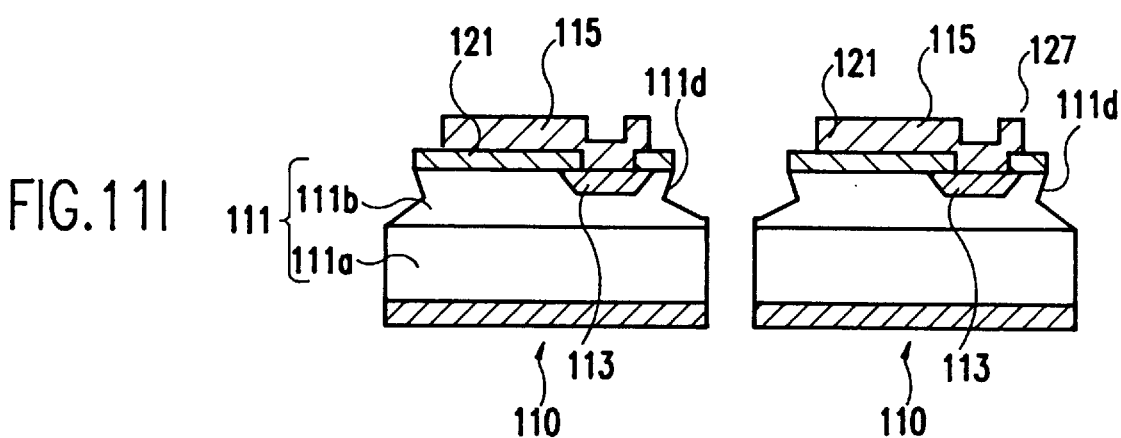

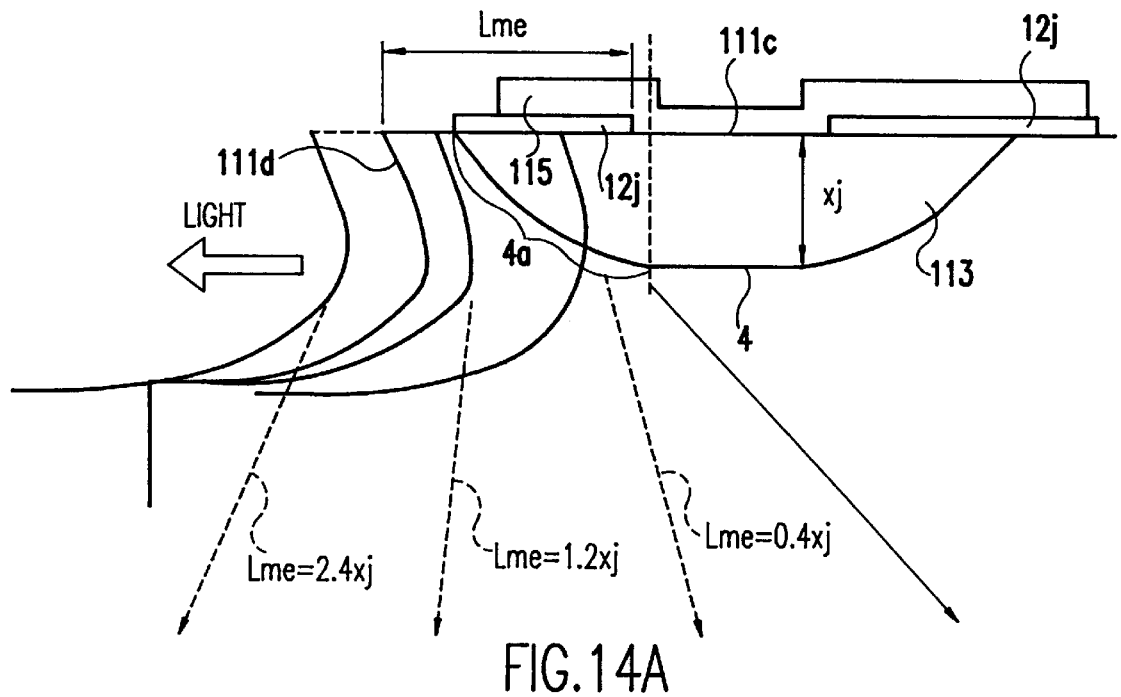
FIG.14A
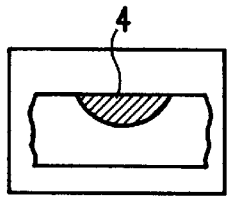 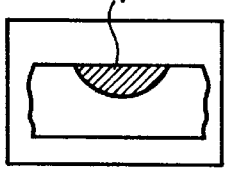 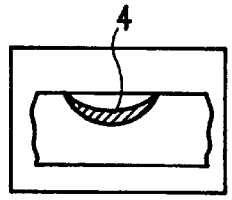 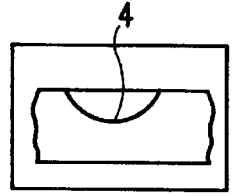
FIG.14B  FIG.14C  FIG.14D  FIG.14E PRIOR ART
   
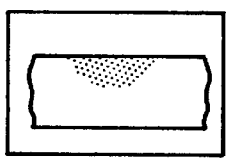 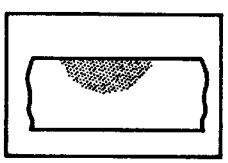 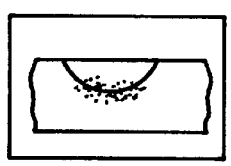 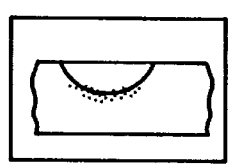
FIG.14F  FIG.14G  FIG.14H  FIG.14I PRIOR ART 5,869,848

END FACE LIGHT-EMITTING-TYPE LED, END FACE LIGHT-EMITTING-TYPE LED ARRAY AND METHODS OF MANUFACTURING THEM

BACKGROUND OF THE INVENTION

The present invention relates to an end face light-emitting-type LED (Light Emitting Diode), an end face light-emitting-type LED array, and methods of manufacturing them.

LED arrays have been used, for example, as light sources in electrophotographic printers. There is a type of LED array which is know by the name of end face light-emitting-type LED array.

Its structure and manufacturing method are disclosed, for example, in Japanese Patent Kokai Publication No. 125765/1990 (hereinafter, referred to as Publication 1). According to the page 3, left upper column of the Publication 1, the end face light-emitting-type LED arrays are formed by dicing a semiconductor wafer having a laminated structure which is composed of an N electrode, an N-type GaAs buffer layer, an N-type AlGaAs layer, a P-type AlGaAs layer and a P electrode.

In the conventional LED array, after forming the P-type region, the end face was formed by cutting both the P-type region and the N-type layer.

However, in the conventional end face light-emitting-type LED array, the end face was formed by cutting both the P-type regions and the N-type layer using a dicing machine and the like. In the LED array formed by this method, only the light emitted from P/N junctions below the P-type regions when viewed from the front of the end face is effectively extracted, so the light intensity emitted from each element was small.

SUMMARY OF THE INVENTION

It is therefore an object of the present invention to provide structures in which a P/N junction is formed on an end face side and the light from the P/N junction can be extracted from the end face with high efficiency, and methods of manufacturing these structures.

According to the present invention, an end face light-emitting-type LED has a first-conductive-type semiconductor substrate and a second-conductive-type diffusion region formed on a first surface of the first-conductive-type semiconductor substrate so as to have a depth within a predetermined value. The first-conductive-type semiconductor substrate has a second surface which meets the first surface at a predetermined angle with the first surface. A junction between the first-conductive-type semiconductor substrate and the second-conductive-type diffusion region includes an inclined portion with regard to the first surface in the vicinity of an edge portion of the junction which is on a side of the second surface, and light emits from the junction via the second surface.

According to the present invention, a method of manufacturing an end face light-emitting-type LED, which emits light from a junction between a first-conductive-type semiconductor substrate and a second-conductive-type diffusion region. The method has the steps of: forming a diffusion prevention film on a first surface of the first-conductive-type semiconductor substrate; forming a first aperture having a predetermined size at a predetermined position in the diffusion prevention film; forming the second-conductive-type diffusion region by diffusing second-conductive-type impurities in the first surface of the first-conductive-type semiconductor substrate via the first aperture; and forming a second surface, which meets the first surface at a predetermined angle, on the first-conductive-type semiconductor substrate. In the step of forming the second-conductive-type diffusion region, the second-conductive-type diffusion region is formed in such a way that the junction between the first-conductive-type semiconductor substrate and the second-conductive-type diffusion region includes an inclined portion with regard to the first surface in the vicinity of an edge portion of the junction which is on a side of the second surface.

BRIEF DESCRIPTION OF THE DRAWINGS

FIGS. 11A–11I are cross sections showing a method of manufacturing the LED array according to the second embodiment;

FIG. 14A is a tracing of a photo of a cross section of an LED array specimen which was actually manufactured;

FIGS. 14B–14E schematically show the configurations of the P/N junctions when viewed from the front of the second surface in the direction parallel to the first surface;

FIGS. 14F–14I schematically show the light extracted from the second surface when viewed from the front of the second surface 111d in the direction parallel to the first surface;

DETAILED DESCRIPTION OF THE INVENTION

Figure 1:
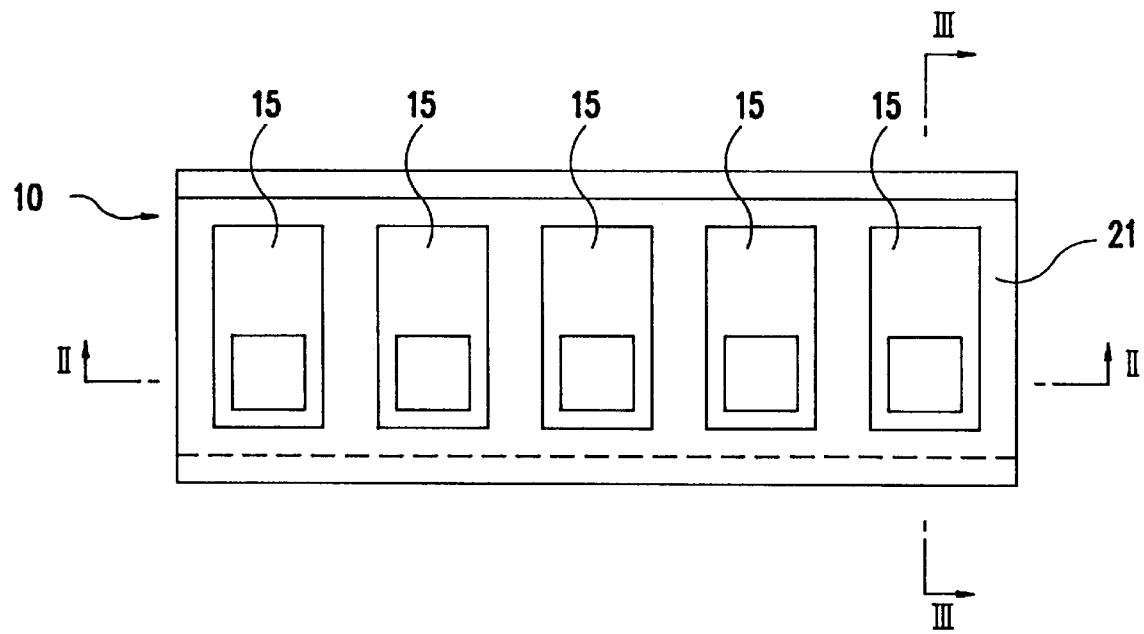
FIG. 1 is a plan view schematically showing a LED array including a plurality of end face light-emitting-type LED according to a first embodiment of the present invention.

Some preferred embodiments of the present invention will now be described with reference to the accompanying drawings. In any drawings, the size, shape and positional relationship of each elements are schematically illustrated so as to understand the present invention. In the drawings used in the description, the same numbers are assigned to the similar elements.

First Embodiment

A first embodiment of the present invention will be described below with reference to the accompanying drawings.

Figure 2:
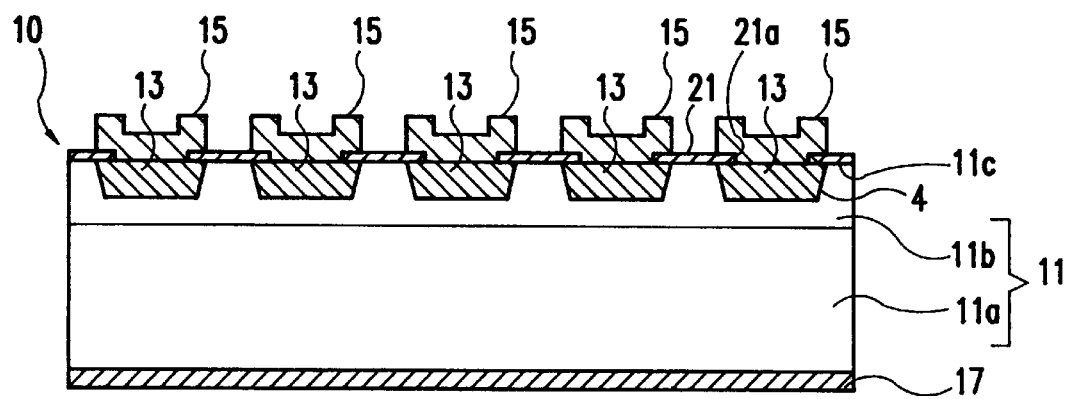
FIG. 2 is a cross section taken along a line A—A and schematically showing the LED array of FIG. 1.
Figure 3:
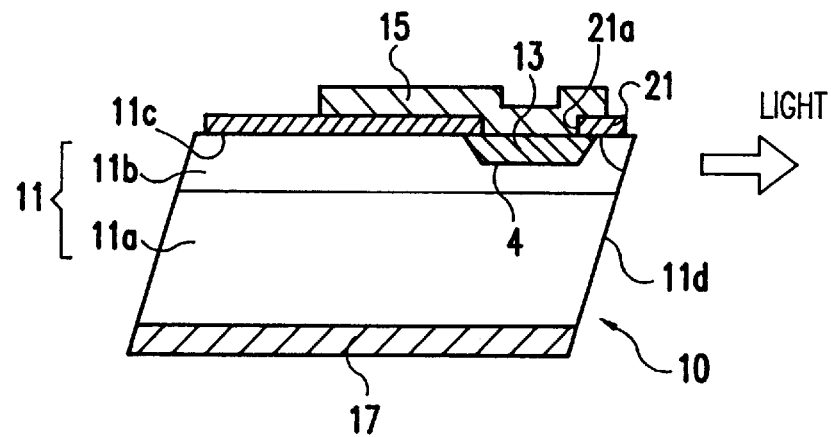
FIG. 3 is a cross section taken along a line B—B and schematically showing the LED array of FIG. 1.

FIG. 1 is a plan view schematically showing an end face light-emitting-type LED array 10 including a plurality of end face light-emitting-type LEDs according to a first embodiment of the present invention, FIG. 2 is a cross section along a line A—A schematically showing the LED array 10 of FIG. 1, and FIG. 3 is a cross section along a line B—B schematically showing the LED array 10 of FIG. 1.

As shown in FIG. 1 to FIG. 3, the LED array 10 comprises a first-conductive-type semiconductor substrate 11, and a plurality of second-conductive-type diffusion regions 13 formed within a predetermined depth on a first surface 11c of the first-conductive-type semiconductor substrate 11. In this embodiment, the first-conductive-type is treated as N-type, and second-conductive-type is treated as P-type. As shown in FIG. 2 and FIG. 3, the N-type semiconductor substrate 11 comprises an N-type gallium arsenic substrate (N-type GaAs substrate) 11a, and an N-type gallium arsenic phosphorus layer (N-type GaAsP layer) 11b epitaxially grown on the N-type GaAs substrate 11a. The P-type diffusion regions 13 are P-type gallium arsenic phosphorus regions (P-type GaAsP regions) formed at predetermined intervals (corresponding to the row pitch of the LEDs). A P/N junction 4 situated between the P-type GaAsP region 13 and the N-type GaAsP layer 11b, is the light emitting part.

As shown in FIG. 1 to FIG. 3, the LED array 10 comprises a diffusion prevention film 21 having a plurality of apertures 21a, and a plurality of P electrodes 15 connected to the P-type diffusion regions 13 via the apertures 21a respectively, on the N-type semiconductor substrate 11. The LED array 10 further comprises an N electrode 17 underneath the N-type semiconductor substrate 11. The diffusion prevention film 21 is necessary during manufacture, and has the function of preventing P-type impurities used in forming the P-type GaAsP region 13 from diffusing outside a predetermined region of the N-type semiconductor substrate 11 in the manufacturing process. The diffusion prevention film 21 is formed of an insulating material, and has the function of electrically insulating the N-type semiconductor substrate 11 and the P electrodes 15. It may be noted that by forming another insulating film having insulating properties on the diffusion prevention film 21, the occurrence of insulation breakdowns may be reduced.

The N-type semiconductor substrate 11 comprises a second surface 11d which meets the first surface 11c at an angle θ. Light is radiated via the second surface 11d from each P/N junction 4, which is a boundary between the N-type semiconductor substrate 11 and the P-type diffusion region 13.

In this case, light which is parallel to the first surface 11c and radiated via the second surface 11d is extracted.

Figure 4:
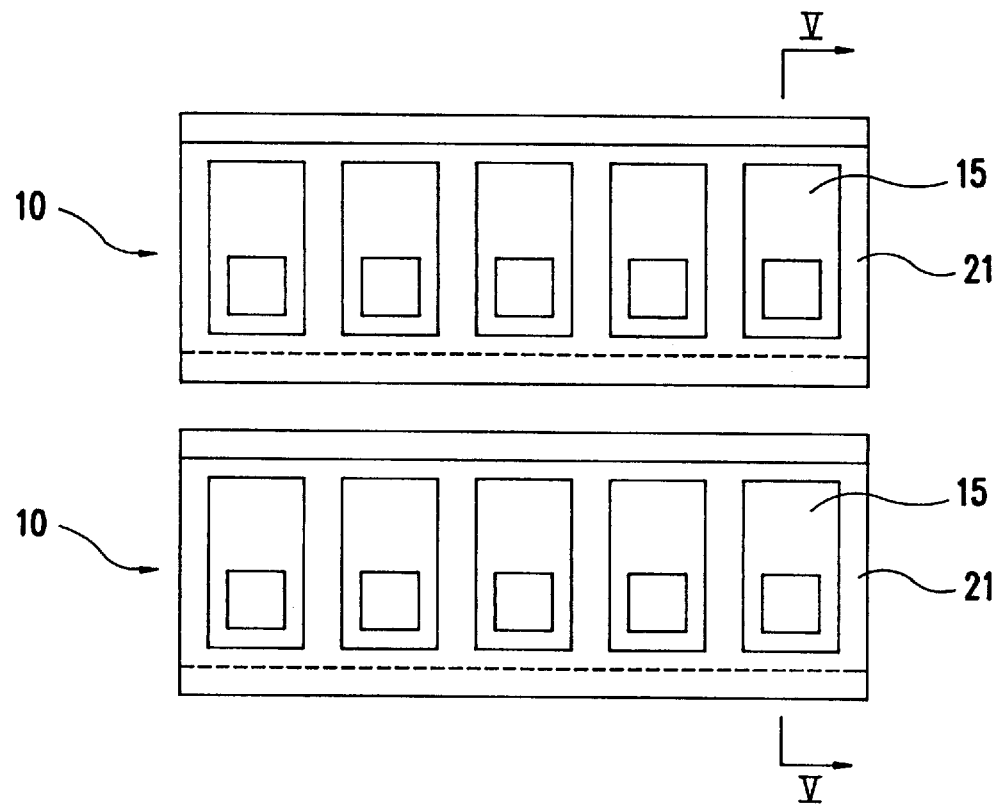
FIG. 4 is a plan view of the diced LED array.

Next, the method of manufacturing the LED array 10 shown in FIG. 1 to FIG. 3 will be described with reference to FIG. 4 and FIGS. 5A–5F. Herein FIG. 4 is a plan view of a diced LED array (corresponding to FIG. 5F), and FIGS. 5A–5F are cross sections showing a method of manufacturing the LED array 10 (cross sections taken along a line C—C in FIG. 4).

Figure 5A:
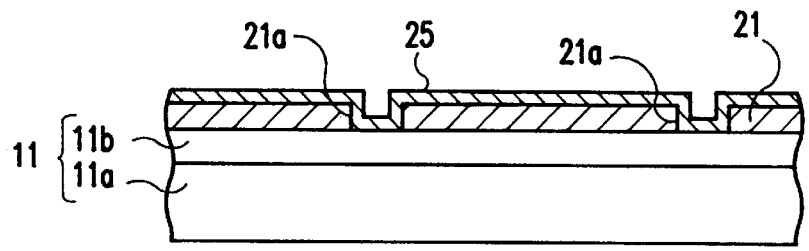
FIGS. 5A–5F are cross sections showing a method of manufacturing the LED array according to the first embodiment.

First, as shown in FIG. 5A, the diffusion prevention film 21 is formed on the N-type GaAsP layer 11b of the N-type semiconductor substrate 11, for example, by the vacuum evaporation method, the sputtering method or the CVD method. The diffusion prevention film 21 is then patterned by photolithography technique and etching technique so as to form the apertures 21a. The diffusion prevention film 21 may be, for example, an alumina film, a silicon nitride film or a silicon oxide film. The film thickness may, for example, lie in the range of 50[nm] to 500[nm].

Next, as shown in FIG. 5A, a diffusion control film 25 is formed on the N-type semiconductor substrate 11 having the diffusion prevention film 21, for example, by the vacuum evaporation method, the sputtering method or the CVD method. The diffusion control film 25 may, for example, be an alumina film, a silicon nitride film, a silicon oxide film or a PSG (Phospho Silicate Glass) film. The film thickness may, for example, lie in the range of 10[nm] to 300[nm]. The diffusion control film 25 is provided so that defects, which is made while the diffusion process, on the outermost surface of the N-type semiconductor substrate 11 do not affect the element, and it is completely removed after the diffusion process is complete as described hereafter. Hence the P-type diffusion region 13 may be formed without forming the diffusion control film 25, however if the diffusion control film 25 is formed, it reduces defects on the outermost surface due to the diffusion process.

Next P-type impurities, for example, zinc (Zn), are caused to diffuse via the diffusion control film 25 into the apertures 21a where the N-type semiconductor substrate 11 is not covered by the diffusion prevention film 21, for example, by the vapor phase diffusion method, so as to form the P-type GaAsP region (diffusion region) 13 having a diffusion depth $X_j$.

Figure 5B:
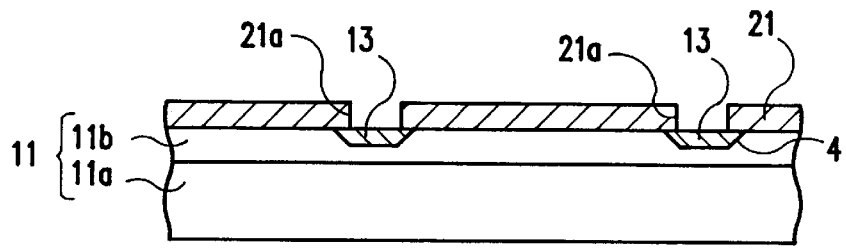

Next, the diffusion control film 25 is removed, for example, by wet etching method or dry etching method, as shown in FIG. 5B.

Figure 5C:
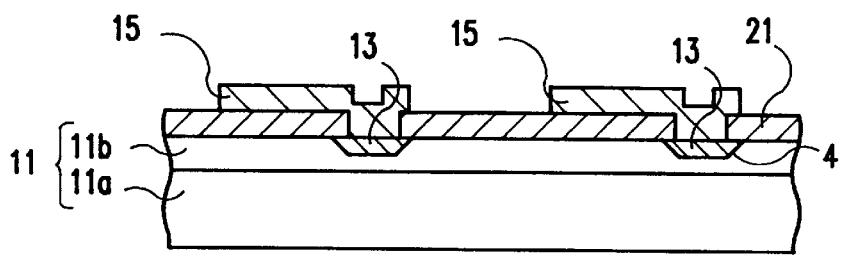

Next, the P electrodes 15 respectively connected to the P-type GaAsP regions 13 are formed by a film forming technique such as the vacuum evaporation method or the sputtering method and fine patterning technique, as shown in FIG. 5C. Herein, there is no particular limitation on the material of the P electrodes 15 provided that it gives good ohmic contact with the P-type GaAsP regions 13, e.g. aluminum may be used as the P electrodes 15.

Figure 5D:
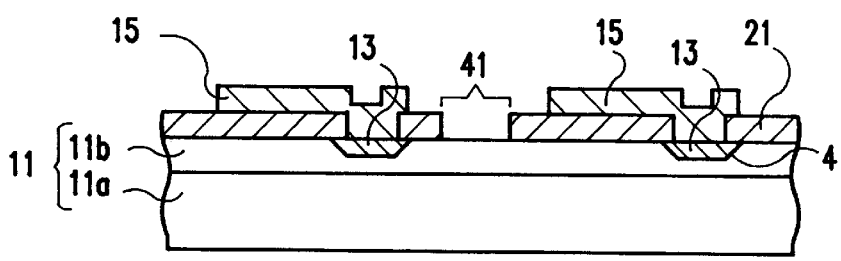

Next, the diffusion prevention film 21 is removed by photolithography-etching from regions 41 which are to be diced between the adjacent LED arrays 10, as shown in FIG. 5D. Dicing may be performed without removing the diffusion prevention film 21 from the regions 41 to be diced, however it is desirable to first remove the diffusion prevention film 21 as otherwise the film may peel and the P electrodes 15 may peel off during dicing.

Figure 5E:
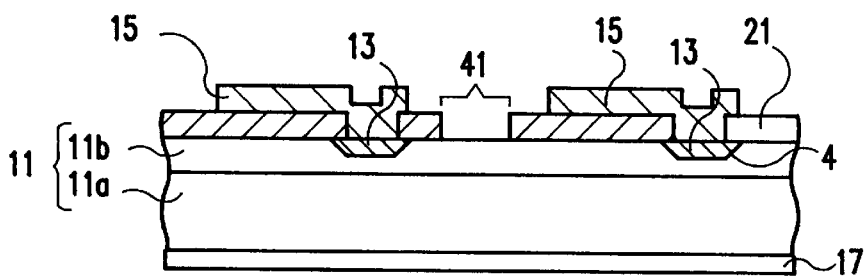

Next, the N electrode 17 is formed on the underside of the N-type semiconductor substrate 11 as shown in FIG. 5E. The N electrode 17 may be formed after polishing the underside of the N-type semiconductor substrate 11 so as to improve characteristics.

Removal of the diffusion prevention film 21 from the regions 41 to be diced (FIG. 5D) may be performed prior to formation of the P electrode 15 (FIG. 5C), and removal of the diffusion prevention film 21 from the regions 41 to be diced (FIG. 5D) may also be performed after formation of the N electrode 17 (FIG. 5E).

The light emitting characteristics and electrical characteristics of the LEDs are then inspected by probing, and the LED arrays are separated into satisfactory and defective products.

Figure 5F:
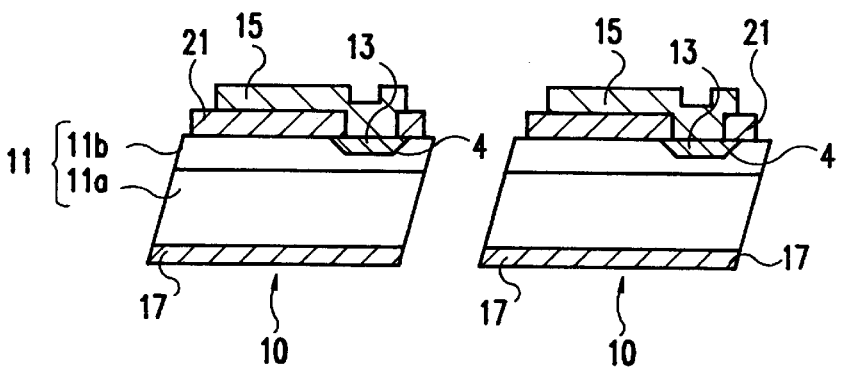

Next, a part between the adjacent LED arrays 10 is obliquely cut by dicing so as to form a second surface (i.e., end face) 11d (FIG. 5F). This second surface 11d has a structure such that light obtained from the P/N junction 4, can be effectively extracted on the side of the second surface 11d. More specifically, the position and angle of the second surface 11d are set so that the P/N junction 4 is belt-shaped when viewed from the front of the second surface 11d in the direction parallel to the first surface 11c. It is preferable that the angle θ (see FIG. 3) of the second surface 11d is less than 90° relative to the first surface 11c (i.e. oblique dicing is preferred). However if the belt-shaped light emission radiated from the P/N junction 4 can be used, dicing may be performed such that the angle θ is 90° or more.

Figure 6:
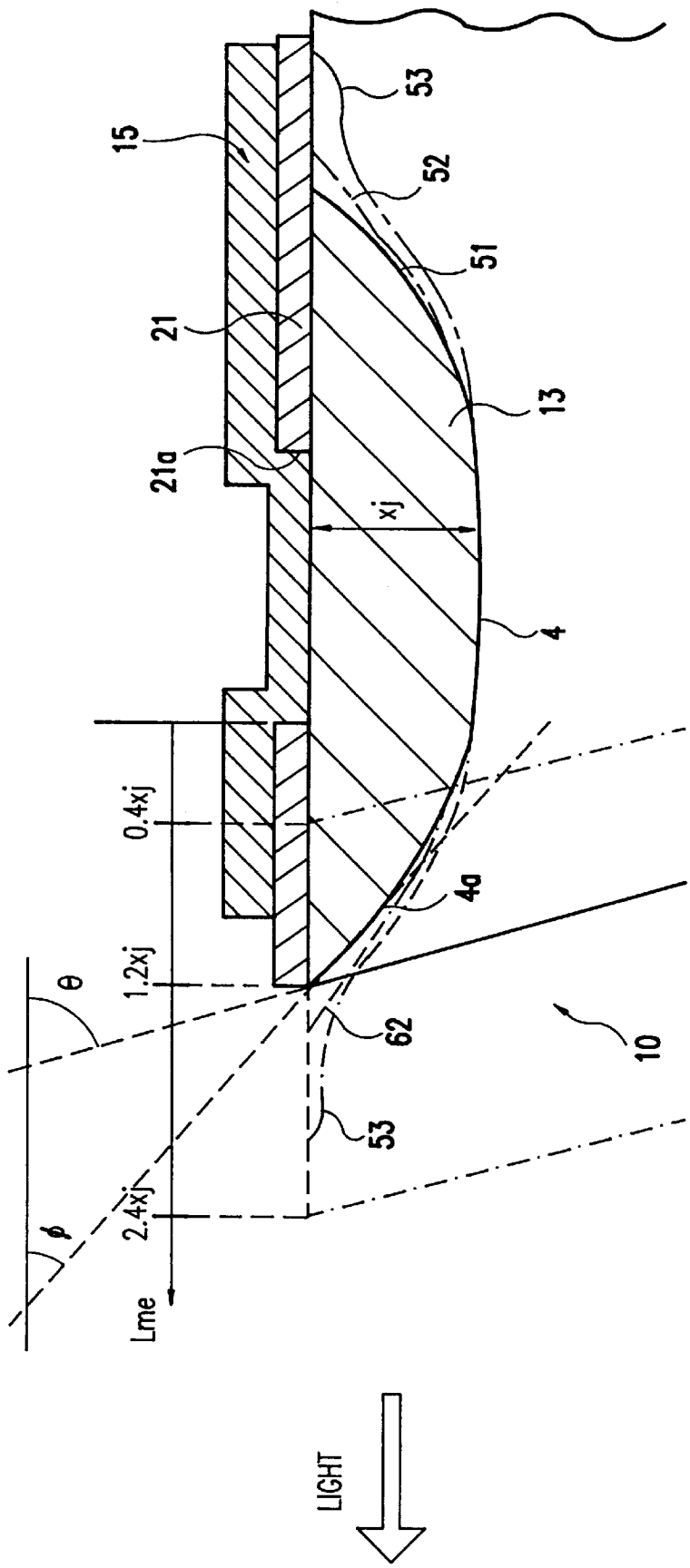
FIG. 6 is a diagram produced by tracing a photo of a cross section of an actual specimen of the end face light-emitting-type LED according to the first embodiment.

FIG. 6 is a tracing of a photo of a cross section of an LED array specimen which was actually manufactured according to the manufacturing method of the first embodiment.

The P-type GaAsP regions 13 are formed by diffusing impurities through the diffusion control film 25 from the apertures 21a in the diffusion prevention film 21. The P-type diffusion regions 13 are then formed over a wider region than the apertures 21a in the diffusion prevention film 21 due to side diffusion, and its cross section has a diffusion shape 51 as shown by the solid line in FIG. 6.

Due to internal stress in the diffusion prevention film 21, the cross section of the P-type diffusion region 13 formed by diffusion may also acquire the diffusion shape 52 or diffusion shape 53. A slant angle φ in a cross section of a side diffusion part of the P-type GaAs region 13 according to this embodiment is approximately of the order of 40°, and the dicing end face is also formed so that it has a slant angle θ. When a difference (θ−φ) between these two angles is small, emitted light can be extracted with high efficiency. When this difference becomes large, the light emission efficiency and extraction efficiency fall, hence it is desirable that the difference (θ−φ) of these two angles is within approximately 50°.

Figure 7:
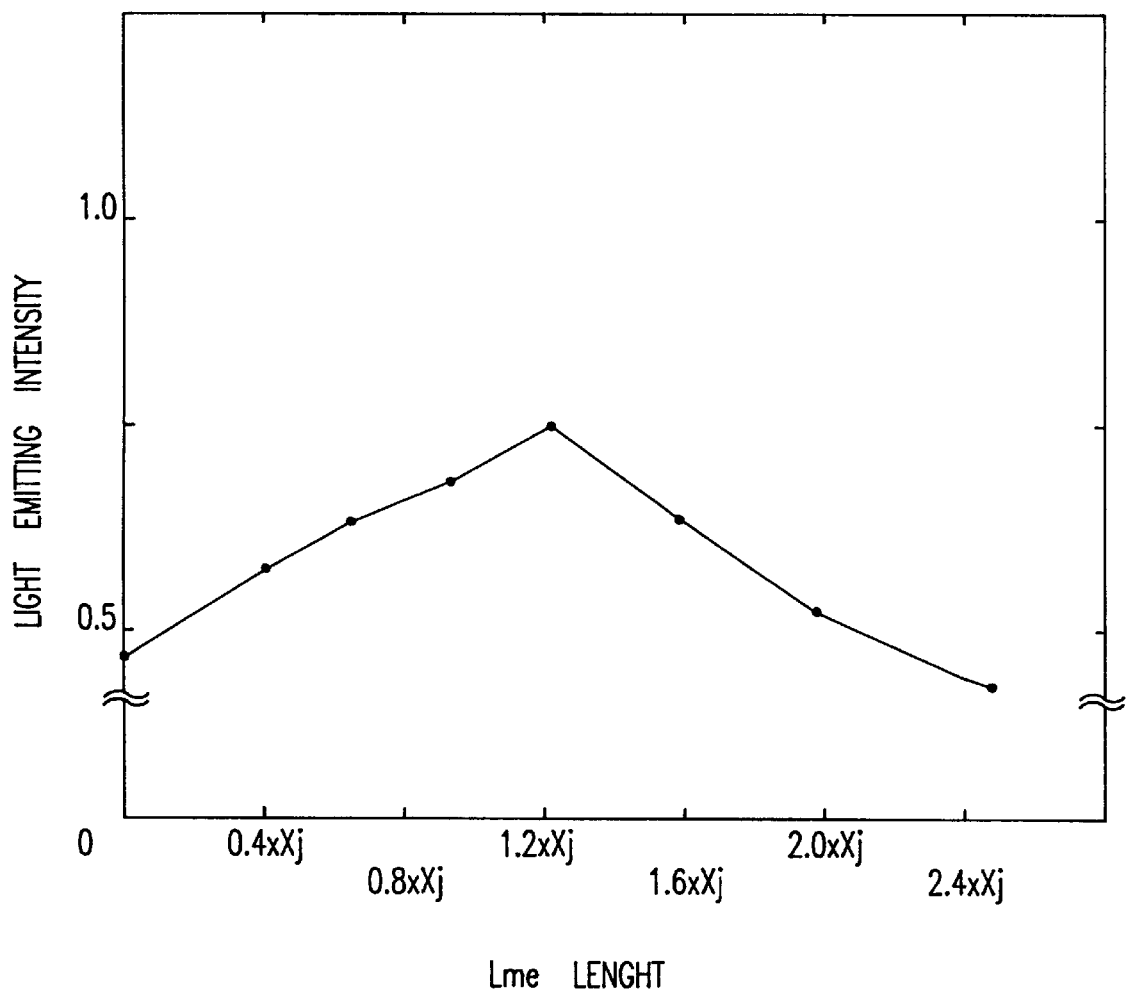
FIG. 7 is a graph showing a relation between a length Lme from an edge of an aperture in a diffusion prevention film to a chip edge formed by dicing, and an end face light emitting intensity, in the end face light-emitting-type LED according to the first embodiment.

FIG. 7 is a graph showing a relation between a length Lme from an edge of the aperture 21a in the diffusion prevention film 21 to the chip edge formed by dicing, and an end face light emitting intensity, in the end face light-emitting-type-LED according to the first embodiment. In this graph, the vertical axis shows relative light intensity (arbitrary units) and the horizontal axis shows Lme length (relation with the depth Xj of the diffusion region 13).

In the case of the solid line in FIG. 6, as regards the side diffusion length which is the diffusion length in a horizontal direction from the aperture 21a of the diffusion prevention film 21 to underneath the diffusion prevention film 21, the slant angle θ in the cross section of the side diffusion part is approximately 40°, and the distance Lme is approximately 1.2 times the diffusion depth Xj. Herein, when Lme lies within the range of from 0.4 times to 2.4 times Xj (referring to 0.4 Xj, 1.2 Xj and 2.4 Xj in FIG. 6), the light intensity that can be extracted from the end face is greater than in the conventional case (the conventional case corresponds to Lme=0).

The end face position is therefore set by dicing such that Lme is equal to from 0.4 times to 2.4 times Xj, i.e., so that the following relational expression (1)

$$0.4 \leq Lme/Xj \leq 2.4 \qquad (1)$$

is satisfied.

The light intensity extracted from the end face is a maximum when Lme has a length equal to 1.2 times Xj. When Lme is less than 1.2 times Xj, the oblique part 4a of the P/N junction 4 on the end face side is cut by dicing so the light intensity decreases.

When Lme is greater than 1.2 times Xj, the light intensity extracted from the emission of the P/N junction 4 through the end face becomes less due to absorption by the N-type layer remaining between the P-type GaAsP region 13 and the second surface 11c.

As described hereinabove, light emitting end faces are formed by dicing and at the same time, arrays are separated (FIG. 5F). Good chips are then selected based on probing determination data, and connected to a drive circuit to fabricate a printer head or the like. After the good chips have been incorporated in the head, they are coated with varnish or the like so as to improve light extraction efficiency. The reason for improvement of light extraction efficiency due to the vanish or the like is described below.

A transmittance Tr of light which is extracted from the substrate and radiated into the air is expressed as follows:

$$Tr = 1 - \frac{(r_{12} + r_{23})^2 - 4r_{12}r_{23}\sin^2\phi}{(r_{12}r_{23} + 1)^2 - 4r_{12}r_{23}\sin^2\phi} \qquad (2)$$

$r_{12} = (n_1 - n_2)/(n_1 + n_2)$ $r_{23} = (n_2 - n_3)/(n_2 + n_3)$ $\phi = 2\pi n_2 d_2/\lambda$ where $n_1$ denotes a refractive index of the substrate, $n_2$ denotes a refractive index of the coated film, $n_3$ denotes a refractive index of the air ($n_3$=1.0), $d_2$ denotes a thickness of the coated film, and $\lambda$ denotes a wavelength of the extracted light.

Figure 8:
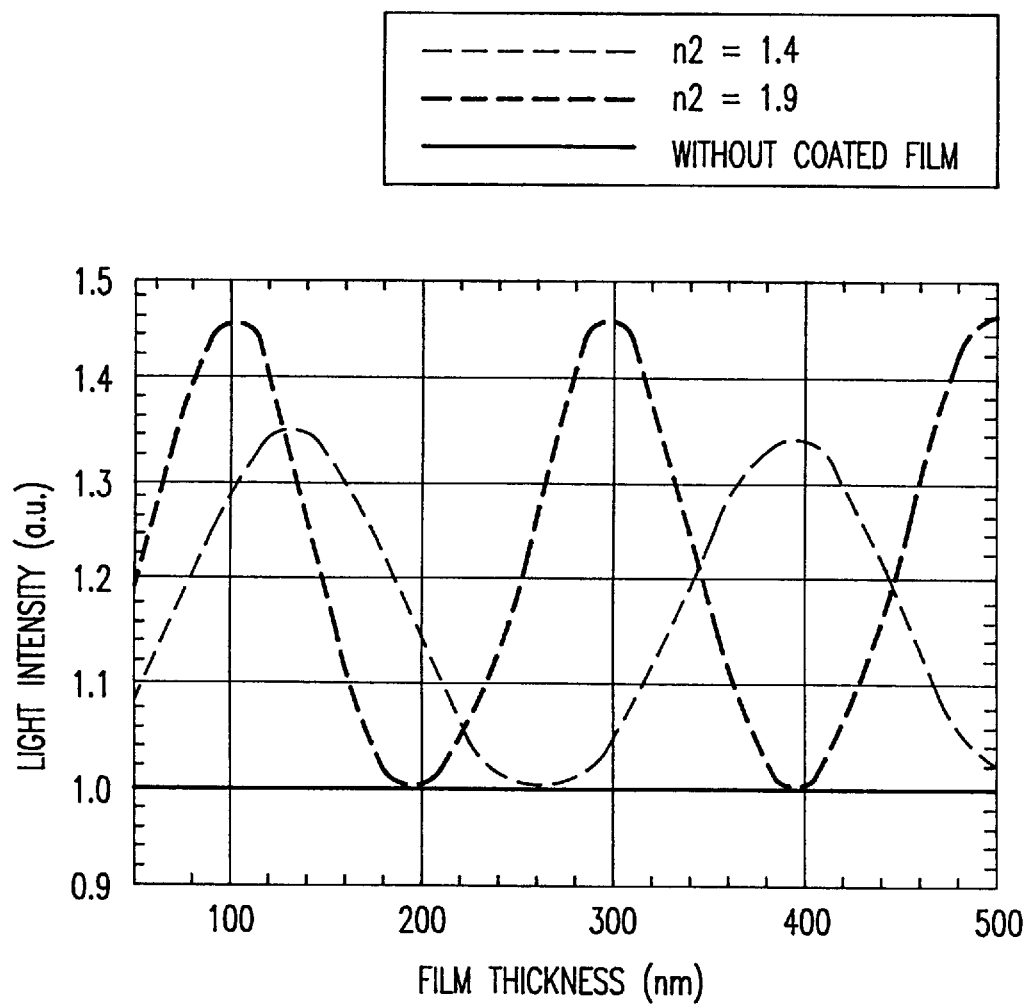
FIG. 8 shows the light intensities extracted from the substrate of the cases when no coated film is provided, when the coated film having a refractive index $n_2$ of 1.4 is provided, and when the coated film having a refractive index $n_2$ of 1.9 is provided.

FIG. 8 shows the light intensities extracted from the substrate of the cases when no coated film is provided (solid line), when the coated film having a refractive index $n_2$ of 1.4 is provided (thin dotted line), and when the coated film having a refractive index of 1.9 is provided (thick dotted line). In these cases, the substrate is a GaAs substrate having a refractive index $n_1$ of 3.5, and the wavelength of the light extracted from LED is 740 [nm]. The light intensities shown in FIG. 8 are obtained by calculation.

FIG. 8 shows that when the coated film having the refractive index $n_2$ between those ($n_1$ and $n_3$) of the air and the substrate is provided on the end face of the substrate, there are regions of the film thickness where light extraction efficiency can be increased in comparison with that without the coated film.

As described above, due to the transparent film such as the vanish formed on the light extraction surface makes it possible to increase the light extraction efficiency.

Further, in case the P/N junction is not cropped out on the second surface 11d, i.e., the condition Lme>1.2 Xj is satisfied, since the P/N junctions are not cropped out, the junctions are prevented from contamination, so reliability of the light emitting parts can be increased.

As described hereinabove, according to the first embodiment, since light is emitted not only from the bottom horizontal part of the P/N junction 4 but also the oblique part 4a of the P/N junction 4 via the second surface 11d, the light intensity can be increased.

Further, in case a part of N-type substrate which is approximately less than 10 [μm] remains between P-type region and the end face of the substrate (second surface) is formed by dicing, the light emitted from the P/N junctions 4 as a light emitting parts can be effectively extracted from the end face. As a result, the light intensity from the end face light emitting LED can be increased. The light is extracted from the second surface in the direction parallel to the first surface.

Second Embodiment

Next, an end face light-emitting-type LED according to a second embodiment of the present invention will be described.

Figure 9:
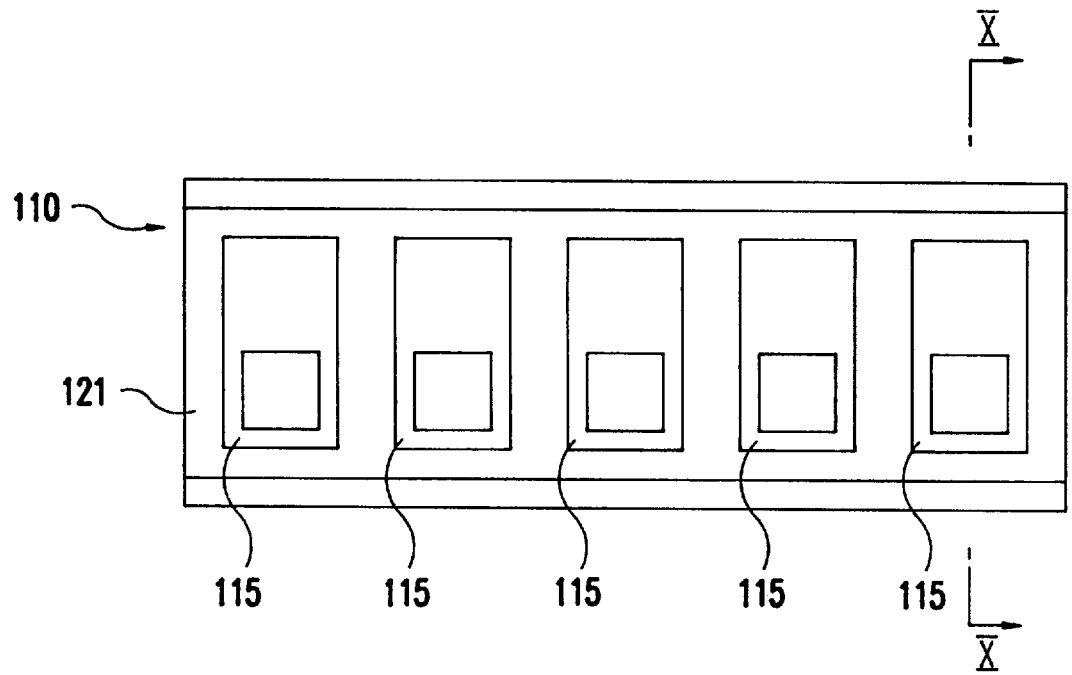
FIG. 9 is a plan view schematically showing an LED array provided with a plurality of end face light-emitting-type LED according to a second embodiment of the present invention.
Figure 10:
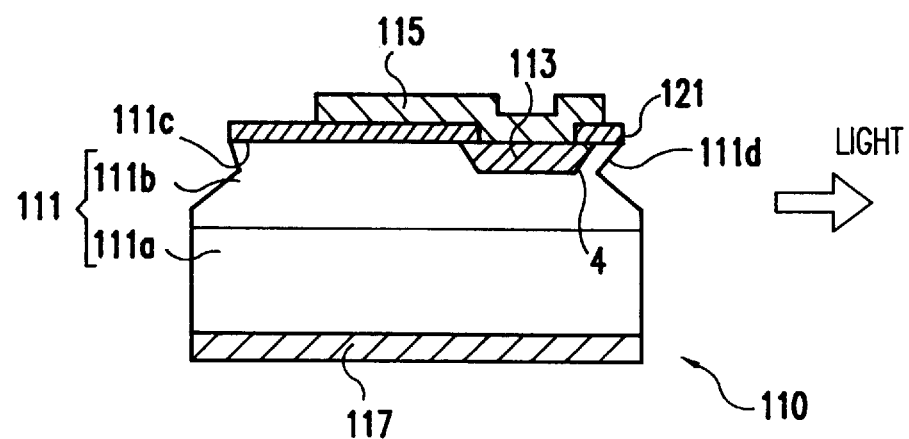
FIG. 10 is a cross section taken along a line D—D and schematically showing the LED array of FIG. 9.

As shown in FIG. 9 and FIG. 10, the LED array 110 comprises a first-conductive-type semiconductor substrate 111, and a plurality of second-conductive-type diffusion regions 113 formed on a first surface 111c of the first-conductive-type semiconductor substrate 111 so as to have a depth within a predetermined value. The first-conductive-type is treated as N-type, and the second-conductive-type is treated as P-type in this embodiment, too.

FIG. 9 is a plan view schematically showing an LED array 110 provided with a plurality of end face light-emitting-type LEDs according to the second embodiment of the present invention. FIG. 10 is a cross section along a line D—D schematically showing the LED array 110 of FIG. 9.

The LED array 110 shown in FIG. 9 and FIG. 10 differs from the LED array 10 shown in FIG. 1 to FIG. 3 insofar as concerns the shape of a second surface hid which is the light emitting surface of the N-type semiconductor substrate 111. Specifically, the second surface 111d shown in FIG. 9 and FIG. 10 differs in that it comprises lateral walls of a depression formed by etching as compared to the plane formed by dicing in the case of the second surface 11d shown in FIG. 1 to FIG. 3.

Figure 11A:
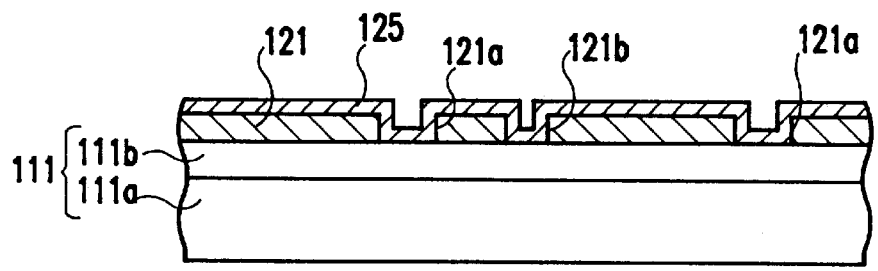

Next, the method of manufacturing the LED array 110 shown in FIG. 9 and FIG. 10 will be described with reference to FIGS. 11A–11I and FIG. 12. Herein, FIGS. 11A–11I are cross sections showing the method of manufacturing the LED array 110 according to the second embodiment, and FIG. 12 is a plan view of FIG. 11B.

First, an N-type GaAsP layer 111b is epitaxially grown on an N-type GaAs substrate 111a so that semiconductor substrate 111 comprising the N-type GaAs substrate 111a and the N-type GaAsP layer 111b is obtained. Next, as shown in FIG. 11A, the diffusion prevention film 121 is formed on the N-type GaAsP layer 111b of the N-type semiconductor substrate 111, for example, by the vacuum evaporation method, the sputtering method or the CVD method. The diffusion prevention film 121 is then patterned by the photolithography technique and the etching technique so as to form the apertures 121a and the apertures 121b. The diffusion prevention film 121 may, for example, be an alumina film, a silicon nitride film or a silicon oxide film. The film thickness may, for example, lie in the range of 50[nm] to 500[nm].

Next, as shown in FIG. 11A, a diffusion control film 125 is formed on the N-type semiconductor substrate 111 having the diffusion prevention film 121, for example, by the vacuum evaporation method, the sputtering method or the CVD method. The diffusion control film 125 may, for example, be an alumina film, a silicon nitride film, a silicon oxide film or a PSG film. The film thickness may, for example, lie in the range of 10[nm] to 300[nm].

Next, P-type impurities, for example, Zn, are caused to diffuse via the diffusion control film 125 into the apertures 121a and the apertures 121b where the N-type semiconductor substrate 111 is not covered by the diffusion prevention film 121, for example, by the vapor phase diffusion method, so as to form the P-type GaAsP regions 113 and 123 having a diffusion depth Xj. The P-type GaAsP regions 113 are regions for forming the P/N junctions 4, and the P-type GaAsP regions 123 are removed by an etching process described hereafter.

Figure 11B:
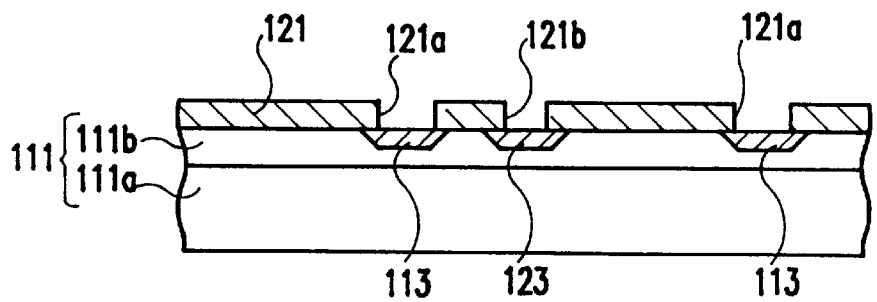
Figure 12:
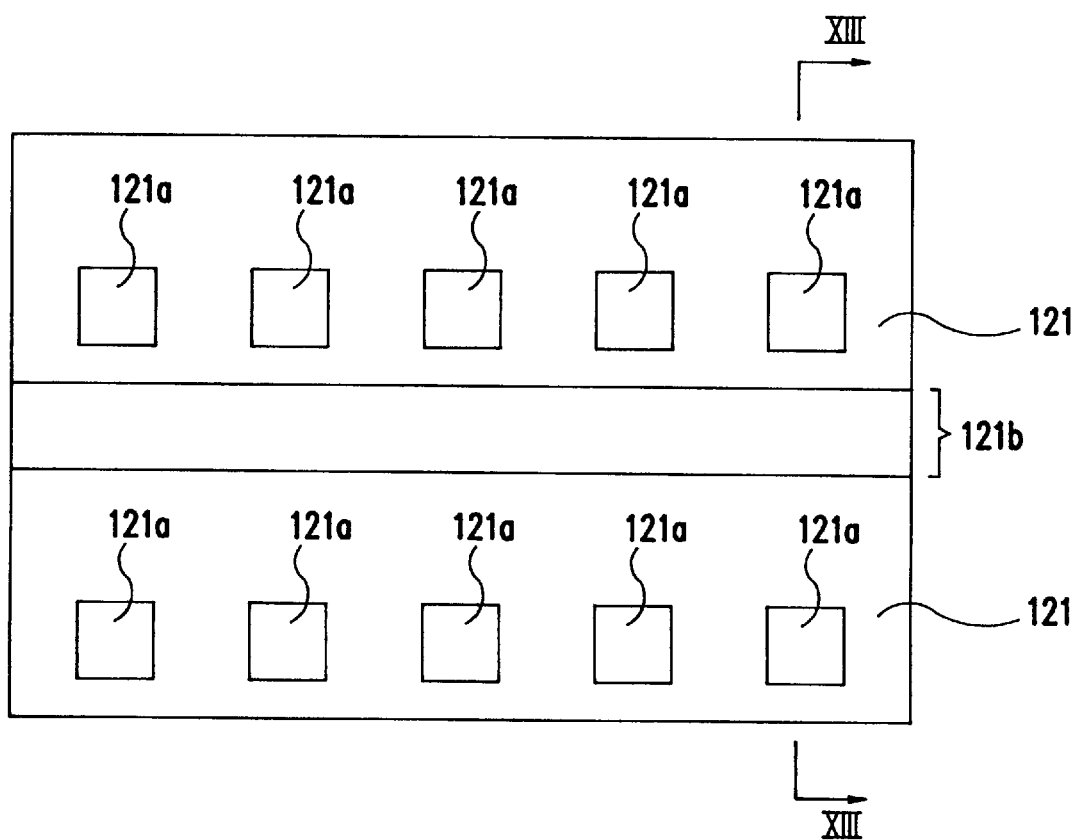
FIG. 12 is a plan view showing the method of manufacturing the LED array according to the second embodiment.

Next, the diffusion control film 125 which is no longer required is removed, for example, by the wet etching method or the dry etching method, so as to give the shape shown in FIG. 11B and FIG. 12.

Figure 11C:
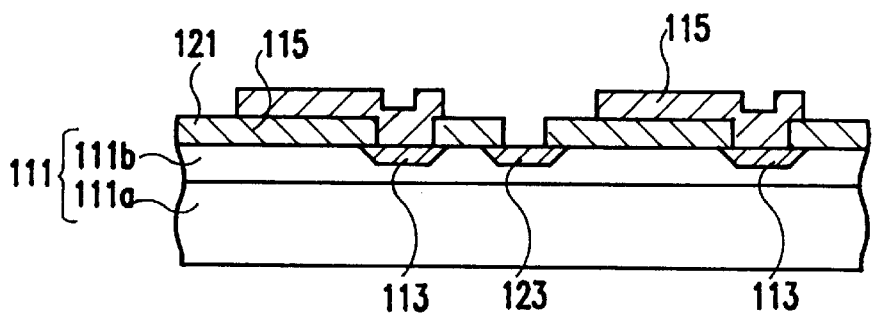

Next, the P electrodes 115 connected to the P-type GaAsP regions 113 are formed by the film forming technique such as the vacuum evaporation method or the sputtering method and the fine patterning technique, as shown in FIG. 11C. Herein, there is no particular limitation on the material of the P electrode 115 provided that it gives good ohmic contact with the P-type GaAsP region 113, e.g. aluminum may be used as the material of the P electrodes 115.

Figure 11D:
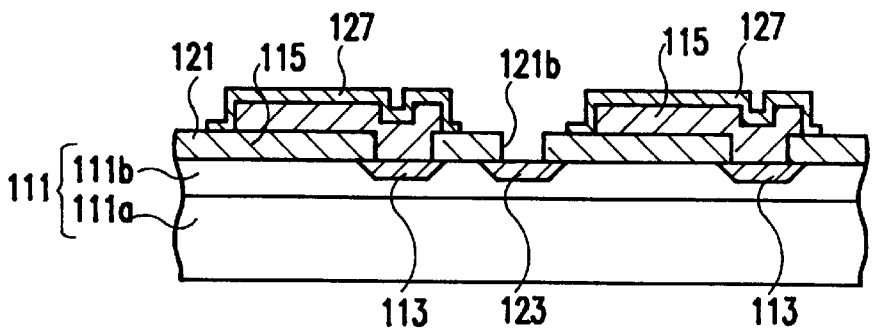

Next, an etching mask 127, which covers regions other than regions where depressions are to be formed which should not be etched during the eaves-like edge removal etching, and which assists the formation of depressions, is formed on the specimen as shown in FIG. 11D.

Figure 11E:
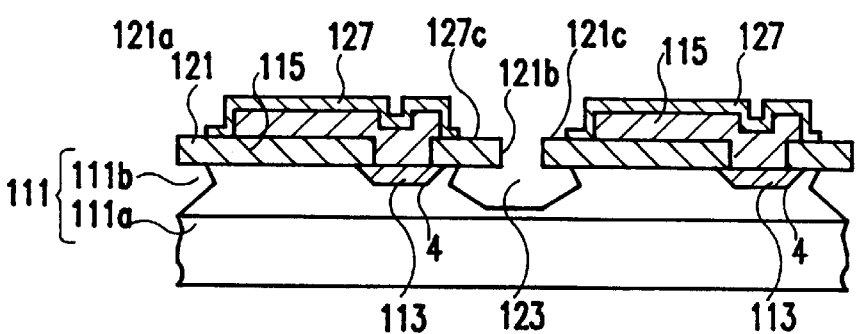

Next, the P-type GaAsP region 123 and the N-type semiconductor substrate 111 in its vicinity are removed by etching so as to form a predetermined depression 128 as shown in FIG. 11E. This depression 128 is formed so as to exceed the depth of the P/N junction 4 comprising the P-type diffusion region 113 and the N-type semiconductor substrate 111. The etching mask 127 may be formed, for example, of the photo-resist. The etching may be wet etching using an aqueous phosphoric acid:hydrogen peroxide system, a citric acid system, a hydrofluoric acid system or a sulfuric acid system.

Next, the eaves-like edges 121c in the diffusion prevention film 121 which functioned as a mask during formation of the depression 128 are removed as shown in FIG. 11F. The diffusion prevention film 121, excepting for those parts covered by the etching mask 127 used to assist formation of the depression 128, is then removed.

Next, the etching mask 127 used to assist formation of the depression 128 is removed by a suitable method as shown in FIG. 11G. The same material may be used for the etching mask 127 as that of the diffusion prevention film 121, however etching may be performed using also a photo-resist or another film as mask.

Next, the N electrode 117 is formed underneath the N-type semiconductor substrate 111 as shown in FIG. 11H, however the N electrode 117 may be formed after polishing the underside of the N-type semiconductor substrate 111 to improve characteristics.

Next, light emitting characteristics and electrical characteristics are inspected by probing, then the N-type semiconductor substrate 111 is cut from the underside of the depression 128 by dicing so as to separate arrays as shown in FIG. 11I. Good chips are selected based on probing determination data, and connected to a drive circuit to fabricate a printer head. In the manufacturing method according to this embodiment, the second surface 111d which emits light is formed by etching, hence high precision is not required of the dicing shown in FIG. 11I and manufacture is facile.

A protective film may also be coated on the end face (second face 111d) of good chips so as to improve emitted light extraction efficiency. It should be noted that the light is extracted from the second surface and advances in a direction parallel to the first surface.

It should be noted that the aforesaid embodiments has been described in the case of an end face light-emitting-type LED array, however the same manufacturing method may be applied to a single end face light-emitting-type LED.

Further, FIGS. 11A–11c show the case that the apertures 121a and 121b are formed by the same patterning process, however the aperture 121b may be formed by another patterning process after the process shown in FIG. 11B or the process shown in FIG. 11C.

Figure 13:
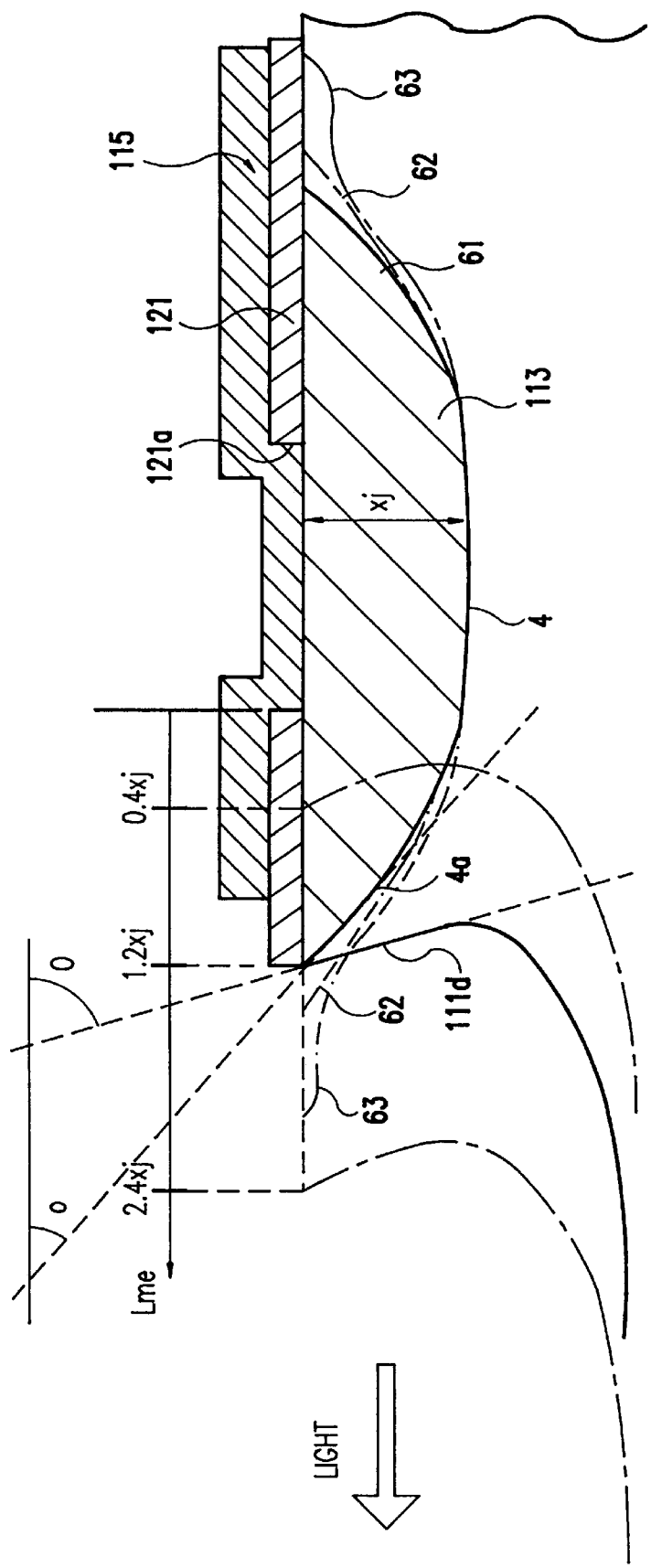
FIG. 13 is a diagram produced by tracing a photo of a cross section of an actual specimen of the end face light-emitting-type LED according to the second embodiment.

FIG. 13 is a tracing of a photo of a cross section of an LED array specimen which was actually manufactured.

The P-type GaAsP regions 113 are formed by diffusing the impurities through the diffusion control film 125 from the apertures 121a in the diffusion prevention film 121 and diffusing the impurities, as described heretofore. The P-type GaAsP regions 113 are formed over a wider region than the apertures 121a in the diffusion prevention film 121 due to side diffusion, and its cross section has a diffusion shape 61 as shown by the solid line in FIG. 13. Due to internal stress in the diffusion prevention film 121, the cross section of the P-type GaAsP region 113 formed by diffusion may also acquire the diffusion shape 62 or diffusion shape 63. A slant angle φ in a section of a side diffusion part of the P-type GaAsP region 113 according to this embodiment is approximately of the order of 40°, and the etched end face is also formed so that it has a slant angle θ. When a difference (θ−φ) between these two angles is small, emitted light can be extracted with high efficiency. When this difference becomes large, the light emission efficiency and extraction efficiency fall, hence it is desirable that the difference (θ−φ) of these two angles is within approximately 50°.

FIG. 14A is a tracing of a photo of a cross section of an LED array specimen which was actually manufactured in a similar way to FIG. 13, FIGS. 14B–14E schematically show the configurations of the P/N junctions 4 when viewed from the front of the second surface 111d in the direction parallel to the first surface 111c, and FIGS. 14F–14I schematically show the light extracted from the second surface 111d when viewed from the front of the second surface 111d in the direction parallel to the first surface 111c.

Since the configuration of the P/N junction 4 of prior art is like a narrow curved line as shown in FIG. 14E, the light intensity emitted from the P/N junction 4 of the prior art LED is small as shown in FIG. 14I.

On the other hand, when Lme is 0.4 Xj, 1.2 Xj or 2.4 Xj (FIGS. 14D, 14C and 14B, and FIGS. 14H, 14G and 14F), since the configuration of the P/N junction 4 is wide belt-shaped or semicircular, the light intensity emitted from the P/N junction 4 via the second surface 111d can be greater than that of prior art LED (FIGS. 14E and 14I).

Further, when the Lme is long (2.4 Xj), as shown in FIGS. 14B and 14F, the configuration of the cross section of the light is semicircular but its intensity is smaller than when Lme is 1.2 Xj. This is because the N-type semiconductor substrate 111 remaining between the P/N junction 4 and the second surface 111d is long, and the light intensity absorbed therein is large.

Further, when the Lme is smaller than 1.2 Xj, as shown in FIGS. 14D and 14H, the configuration of the cross section of the light is arc but its intensity is smaller than when Lme is 1.2 Xj. This is because when the configuration of the P/N junction 4 is belt-shaped as shown in FIG. 14D and the configuration of the cross section of the light is also belt-shaped as shown in FIG. 14H, lighting area is reduced, so the light intensity is small.

Figure 15:
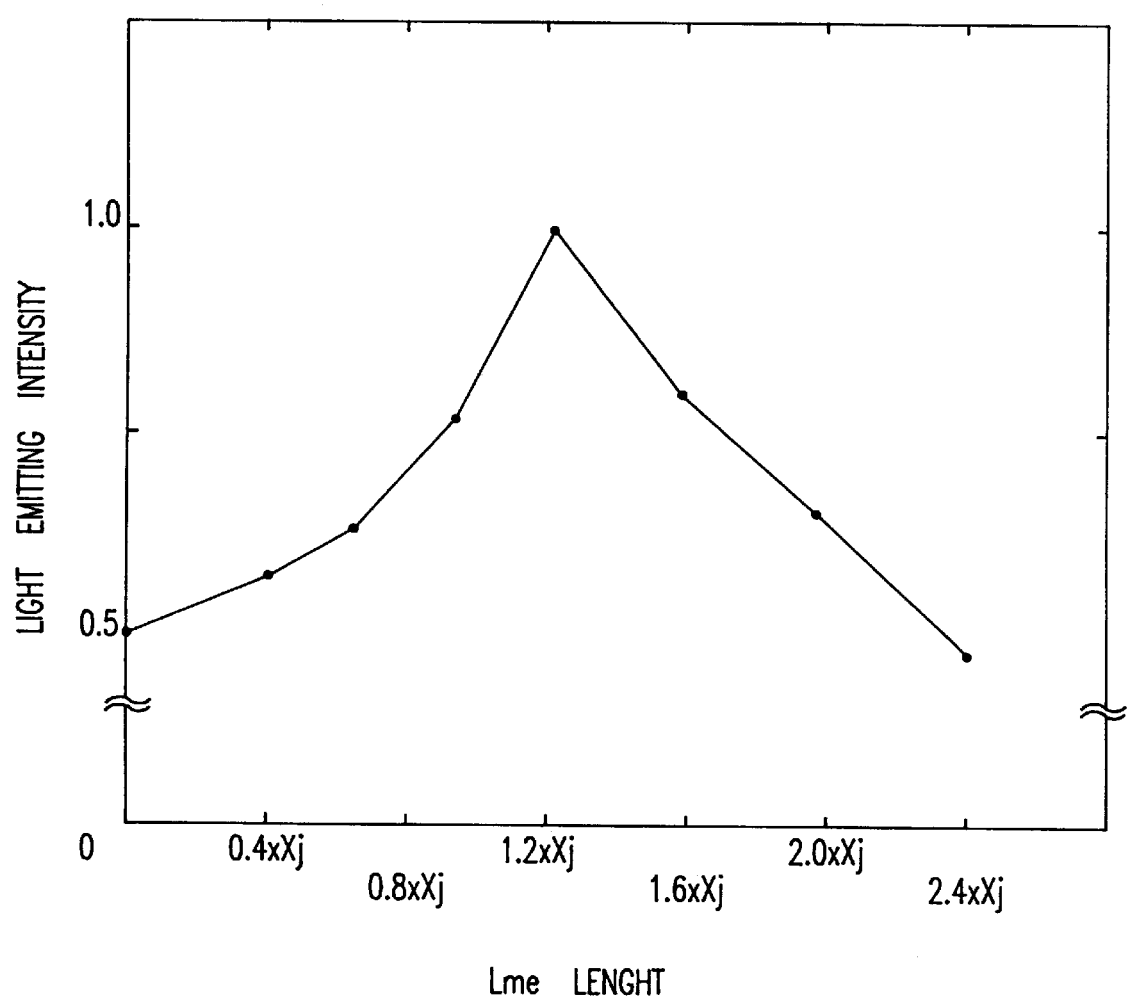
FIG. 15 is a graph showing a relation between a length Lme from an edge of an aperture in a diffusion prevention film to a chip edge formed by dicing, and an end face light emitting intensity, in the end face light-emitting-type LED according to the second embodiment.

FIG. 15 is a graph showing a relation between a length Lme from an edge of the aperture 121a in the diffusion prevention film 121 to the edge formed by etching, and an end face light emitting intensity, in the end face light-emitting-type LED according to the second embodiment. In FIG. 15, the vertical axis shows relative light emitting intensity (arbitrary scale) and the horizontal axis shows Lme length (relation to the depth Xj of the diffusion region 113).

In the case of the solid line of this embodiment, the side diffusion length which is the diffusion length in a horizontal direction from the aperture 121a of the diffusion prevention film 121 to beneath the diffusion prevention film 121, as can be seen also from the fact that the slant angle θ in the cross section of the side diffusion part is approximately 40°, has a length which is approximately 1.2 times the diffusion depth Xj.

Herein, when Lme lies within the range of from 0.4 times to 2.4 times Xj (referring to 0.4 Xj, 1.2 Xj and 2.4 Xj in FIG. 15), the light intensity that can be extracted from the end face is greater than in the conventional case (the conventional case corresponds to Lme=0), and is a maximum when Lme has a length equal to 1.2 times Xj. When Lme is less than 1.2 times Xj, the oblique part of the P/N junction on the end face side is cut by etching so the light intensity decreases.

When Lme is greater than 1.2 times Xj, the light intensity extracted from the light emission of the P/N junction to the end face becomes less due to absorption by the N-type layer remaining between the region 113 and the end face. The end face position is therefore set by etching such that Lme is equal to from 0.4 times to 2.4 times Xj, i.e., so that the following relational expression (1)

$$0.4 \leq Lme/Xj \leq 2.4 \tag{1}$$

is satisfied.

Subsequently, good chips are selected based on probing determination data, and connected to a drive circuit to fabricate a printer head. After the good chips have been incorporated in the head, they are coated with varnish or the like, as has been described above, so as to improve light extraction efficiency.

The slant angle in a cross section of the side diffusion part of a P-type GaAsP region 113 according to this embodiment approximates to the order of 40°, and the shape of the main part of a reverse-tapered contour of a depression 128 is approximately 75°. When the difference between these angles is small, light is emitted efficiently and the emitted light can be extracted with high efficiency. As the light emitting efficiency and light extracting efficiency fall when this difference increases, it is preferred that the difference between the two angles is within approximately 50°.

Further, when Lme>1.2 Xj, i.e., the P/N junction is not cropped out to the second surface 111d, contamination of the P/N junction is prevented, the reliability of the light emitting part can be increased.

N-type semiconductor substrate 111 has the second surface 111d intersecting the first surface 111c at an angle θ, and light is emitted from the P/N Junction 4 between the N-type semiconductor substrate 111 and the P-type diffusion region 113 through the second surface 111d. The emitted light is extracted from the second surface in a direction parallel to the first surface.

In the above-mentioned first and second embodiments, the first-conductive-type semiconductor is treated as N-type and the second-conductive-type semiconductor is treated as P-type. However, it is possible that the first-conductive-type semiconductor is P-type and the second-conductive-type semiconductor is N-type.

As described above, when the depression on the end face side is formed and the end face is formed, since end face configuration of the depression is reverse-tapered and the N-type layer which is equal or less than 10 [μm] remains between the P-type region and the end face, light from the P/N junction as the light emitting part can be extracted from the end face. As a result, light intensity of the end face light-emitting-type LED can be increased.

Further, when Lme>1.2 Xj, i.e., the P/N junction is not cropped out to the second surface 111d, contamination of the P/N junction is prevented, the reliability of the light emitting part can be increased.

Furthermore, according to the second embodiment, the second surface is formed with higher accuracy than that formed by dicing. Since the light emitting area is protected from lack or defects resulting from dicing, LED with small light intensity variation and high reliability can be formed.

Third Embodiment

The above-mentioned first and second embodiments describe the cases in which the light is extracted from the second surface in the direction parallel to the first surface.

If the direction of extracted light is perpendicular to the second surface, the light can be extracted with higher efficiency.

This is because when the light impinges on an interface between two different media having different refractive indexes, the light impinging on the interface with an incident angle shown in the following expression (critical angle) or more is totally reflected.

$$\theta c = \sin^{-1}(n_2/n_1)$$

where θc is referred to as the critical angle. If the light impinges on the interface with an incident angle larger than the critical angle, the light is totally reflected, so no light can be extracted outside from the substrate. $n_1$ denotes the refractive index of the substrate, and the GaAsP substrate of this embodiment has the refractive index of 3.57. $n_2$ denotes the refractive index of air and is 1.0. In this case, the critical angle is 16.3°. If the incident angle of the light is equal to or more than the critical angle, the light can not be emitted from the end face.

If the direction of the extracted light is perpendicular to the second surface 11d or 111d, the light can be extracted from the end face with higher efficiency.

Figure 16A:
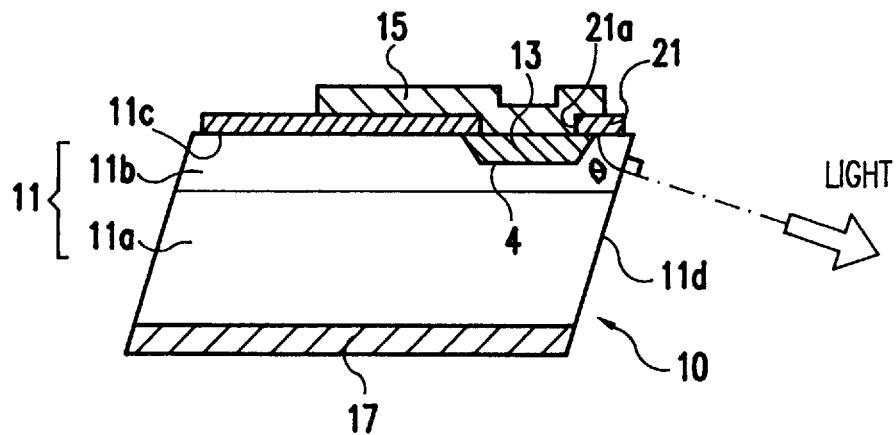
FIGS. 16A and 16B are explanatory diagrams showing an end face light-emitting-type LED according to a third embodiment in which a direction of light extracted from the end face is modified.
Figure 16B:
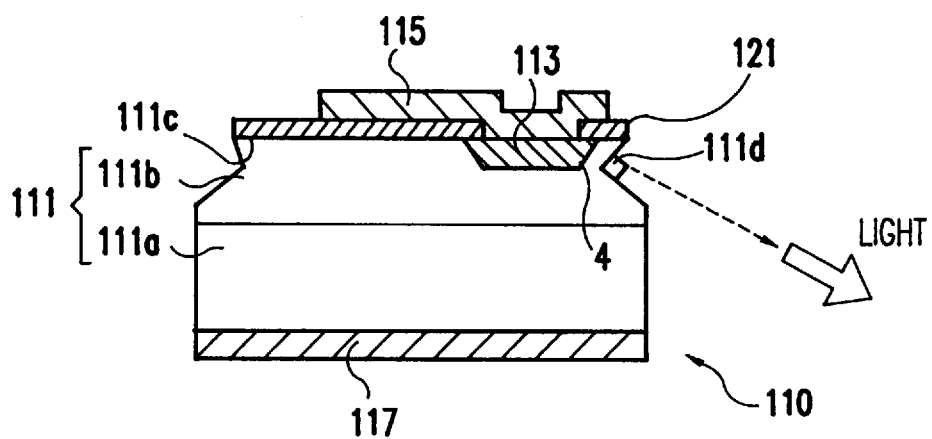

FIG. 16A schematically shows the element of the first embodiment in which the light is extracted in a direction perpendicular to the second surface 11d, and FIG. 16B schematically shows the element of the second embodiment in which the light is extracted in a direction perpendicular to the second surface 111d.

If the light is extracted from and perpendicular to the second surface 11d or 111d, the end face light-emitting-type LED array should be equipped obliquely and some idea for equipment is required.

As described above, since the light is extracted from and perpendicular to the second surface 11d or 111d, the light intensity of the extracted light can be increased in comparison with the first and second embodiments.

Fourth Embodiment

Next, a fourth embodiment will be described, wherein one of the LED arrays of the above-mentioned first to third embodiments is applied to the light source device for electrophotographic printer or the like.

Figure 17A:
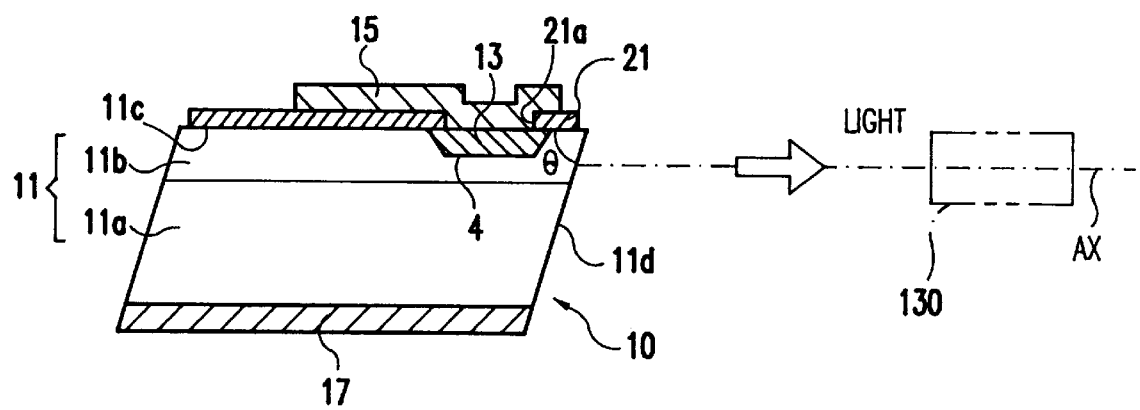
FIGS. 17A to 17D are explanatory diagrams showing a light source device according to a fourth embodiment.
Figure 17B:
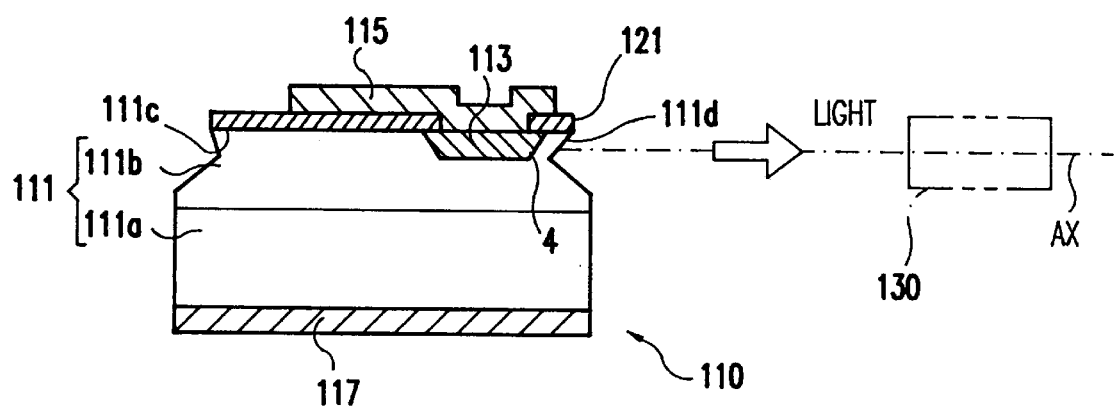

FIG. 17A schematically shows a light source device comprising the LED array of the first embodiment and a lens, and FIG. 17B schematically shows a light source device comprising the LED array of the second embodiment and a lens. In FIGS. 17A and 17B, the light is extracted from the second surface in a direction parallel to the first surface, and the optical axis AX of the lens 130 coincides with the direction of the extracted light.

Figure 17C:
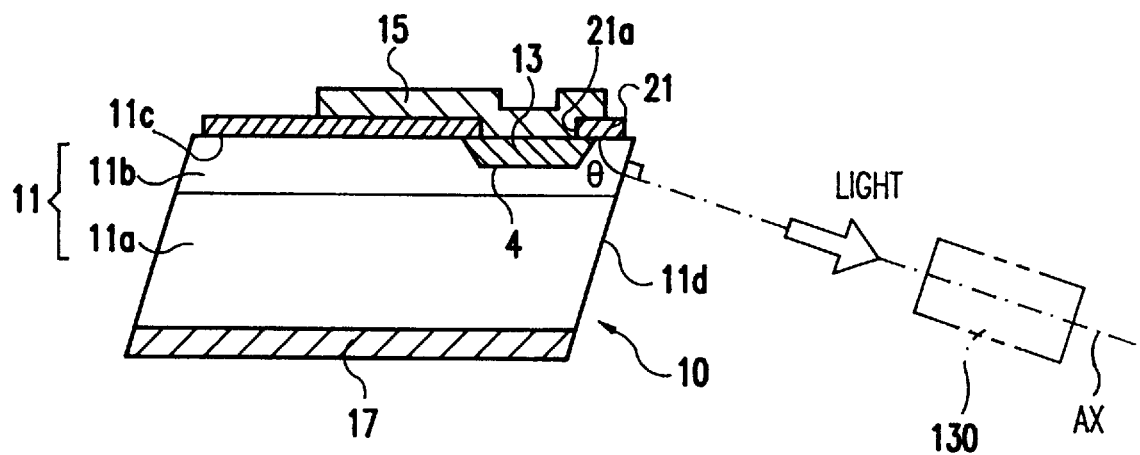
Figure 17D:
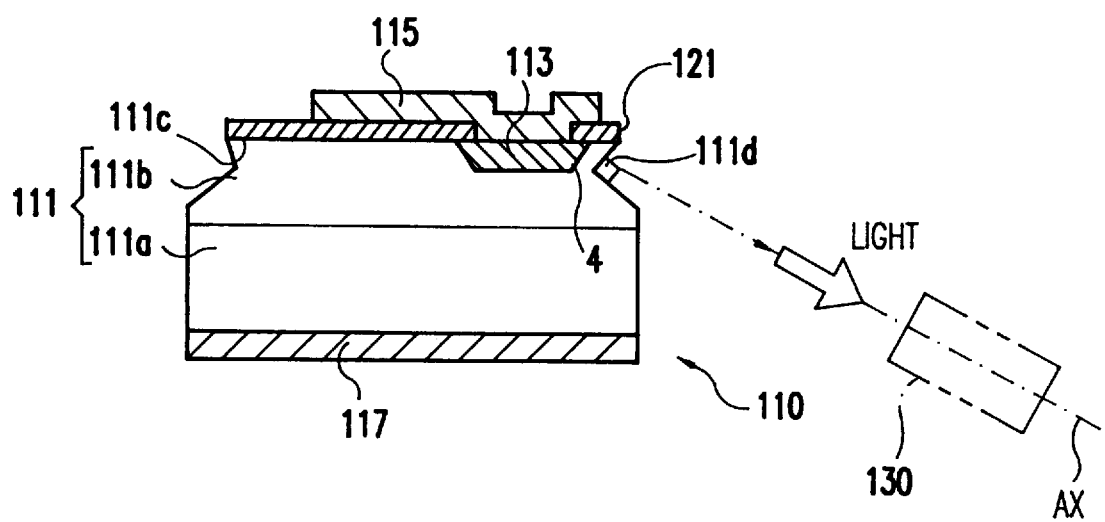

FIG. 17C schematically shows a light source device comprising the LED array of the third embodiment and a lens, and FIG. 17D schematically shows a light source device comprising the LED array of the fourth embodiment and a lens. In FIGS. 17C and 17D, the light is extracted from and perpendicular to the second surface, and the optical axis AX of the lens 130 coincides with the direction of the extracted light.

What is claimed is:

1. A light emitting diode which emits light in a light emission direction from an end facet thereof, comprising:
    a semiconductor substrate of a first conductivity type having a first principal surface, and an inclined end facet surface which extends downwardly from a terminal edge of said first principal surface such that an angle within said substrate between said first principal surface and said inclined end facet surface is a predetermined angle; and
    a diffusion region of a second conductivity type formed at a depth in said first principal surface of said semiconductor substrate, said diffusion region having a principal upper surface coincident with said first principal surface of said substrate and a principal lower surface which is located at said depth opposite said principal upper surface, and said diffusion region further having an inclined side surface which extends between said principal upper and lower surfaces and which faces towards said inclined end facet surface of said semiconductor substrate, wherein at least a part of said inclined side surface of said diffusion region is spaced from said inclined end facet surface of said semiconductor substrate, wherein said inclined side surface of said diffusion region is formed such that when viewed through said end facet from an outside of said light emitting diode in a direction parallel to the first principal surface of said semiconductor substrate, a junction between said semiconductor substrate and said diffusion region is belt-shaped:
    wherein light is produced at the junction, and is then emitted from said end facet of said light emitting diode.

2. The light emitting diode of claim 1, wherein a part of said semiconductor substrate is interposed between said inclined side surface of said- diffusion region and said inclined end facet surface.

3. The light emitting diode of claim 2, wherein said end facet is formed by said inclined end facet surface of said semiconductor substrate.

4. The light emitting diode of claim 2, wherein said end facet is formed by said diffusion region, said junction and said semiconductor substrate.

5. The light emitting diode of claim 1, wherein an angle between said principle surface and said inclined end facet surface is less than 90°.

6. The light emitting diode of claim 1, wherein a relational expression θ−Φ≦50° is satisfied, in which θ denotes an angle between said principle surface and said inclined end facet surface, and Φ denotes an angle between said first principle surface and said inclined side surface.

7. The light emitting diode of claim 1, further comprising a diffusion prevention film including an aperture on said semiconductor substrate, wherein said diffusion region is formed directly beneath and in the vicinity of said aperture.

8. The light emitting diode of claim 7, wherein a conditional expression $0.4 \leq Lme/Xj \leq 2.4$ is satisfied, wherein Xj denotes said depth, and Lme denotes an interval from said terminal edge to an edge of said aperture positioned towards said terminal edge.

9. The light emitting diode of claim 7, wherein a thickness of said diffusion prevention film is in a range of 50 nm to 500 nm.

10. The light emitting diode of claim 7, wherein said diffusion prevention film is made of material selected from the group consisting of alumina, silicon nitride and silicon oxide.

11. The light emitting diode of claim 1, wherein said semiconductor substrate is a N-type semiconductor substrate, said diffusion region is a P-type diffusion region, and said junction is a P/N junction.

12. The light emitting diode of claim 11, wherein said N-type semiconductor substrate comprises an N-type GaAs substrate, and an N-type GaAsP layer formed on said N-type GaAs substrate.

13. The light emitting diode of claim 11, wherein said P-type diffusion region is a P-type GaAsP region.

14. An end facet light-emitting-type LED array comprising a common substrate formed by a semiconductor substrate of a first conductivity type, and an array of plural light emitting diodes formed on said common substrate, each of said light emitting diodes for emitting light in a light emitting direction from an end facet thereof, and each comprising:

a portion of said semiconductor substrate having a first principal surface, and an inclined end facet surface which extends downwardly from a terminal edge of said first principal surface such that an angle within said substrate between said first principal surface and said inclined end facet surface is a predetermined angle; and a diffusion region of a second conductivity type formed at a depth in said first principal surface of said portion of said semiconductor substrate, said diffusion region having a principal upper surface coincident with said first principal surface of said portion of said substrate and a principal lower surface which is located at said depth opposite said principal upper surface, and said diffusion region further having an inclined side surface which extends between said principal upper and lower surfaces and which faces towards said inclined end facet surface of said portion of said semiconductor substrate, wherein at least a part of said inclined side surface of said diffusion region is spaced from said inclined end facet surface of said portion of said semiconductor substrate, wherein said inclined side surface of said diffusion region is formed such that when viewed through said end facet from an outside of said LED array in a direction parallel to the first principal surface of said semiconductor substrate, a junction between said semiconductor substrate and said diffusion region is belt-shaped;

wherein a part of said semiconductor substrate is interposed between said inclined side surface of said diffusion region and said inclined end facet surface, and wherein light is produced at the junction, and is then emitted from said end facet of said light emitting diode.

15. An end facet light-emitting-type LED array as claimed in claim 14, wherein said end facet is formed by said inclined end facet surface of said semiconductor substrate.

16. An end face light-emitting-type LED array as claimed in claim 14, wherein said end facet is formed by said diffusion region, said junction and said semiconductor substrate.

17. An end facet light-emitting-type LED array comprising a common substrate formed by a semiconductor substrate of a first conductivity type, and an array of plural light emitting diodes formed on said common substrate, each of said light emitting diodes for emitting light in a light emitting direction from an end facet thereof, and each comprising:

a portion of said semiconductor substrate having a first principal surface, and an inclined end facet surface which extends downwardly from a terminal edge of said first principal surface such that an angle within said substrate between said first principal surface and said inclined end facet surface is a predetermined angle; and a diffusion region of a second conductivity type formed at a depth in said first principal surface of said portion of said semiconductor substrate, said diffusion region having a principal upper surface coincident with said first principal surface of said portion of said substrate and a principal lower surface which is located at said depth opposite said principal upper surface, and said diffusion region further having an inclined side surface which extends between said principal upper and lower surfaces and which faces towards said inclined end facet surface of said portion of said semiconductor substrate, wherein at least a part of said inclined side surface of said diffusion region is spaced from said inclined end facet surface of said portion of said semiconductor substrate, wherein said inclined side surface of said diffusion region is formed such that, when viewed through said end facet from an outside of said LED array in a direction parallel to the first principal surface of said semiconductor substrate a junction between said semiconductor substrate and said diffusion region is belt-shaped;

wherein said semiconductor substrate is a N-type semiconductor substrate, said diffusion region is a P-type diffusion region, and said junction is a P/N junction, and wherein light is produced at the junction, and is then emitted from said end facet of said light emitting diode.

18. A light source device comprising:

an end facet light emitting diode array including a common semiconductor substrate having a plurality of light emitting diodes which emit light in a light emission direction from respective end facets thereof; and a lens which condenses the light emitted from the respective end facets of said plurality of light emitting diodes;

where each of said plurality of light emitting diodes comprises,
(a) said common semiconductor substrate of a first conductivity type having a first principal surface, and an inclined end facet surface which extends downwardly from a terminal edge of said first principal surface such that an angle within said substrate between said first principal surface and said inclined end facet surface is less a predetermined angle; and (b) a diffusion region of a second conductivity type formed at a depth in said first principal surface of said common semiconductor substrate, said diffusion region having a principal upper surface coincident with said first principal surface of said common semiconductor substrate and a principal lower surface which is located at said depth opposite said principal upper surface, and said diffusion region further having an inclined side surface which extends between said principal upper and lower surfaces and which faces towards said inclined end facet surface of said common semiconductor substrate, wherein at least a part of said inclined side surface of said diffusion region is spaced from said inclined end facet surface of said semiconductor substrate, wherein said inclined side surface of said diffusion region is formed such that, when viewed through said end facet from an outside of said light emitting diode array in a direction parallel to the first principal surface of said semiconductor substrate, a junction between said semiconductor substrate and said diffusion region is belt-shaped;

wherein light is produced at the junction, and is then emitted from said end facet of said light emitting diode.

19. The light source device of claim 18, wherein said lens is disposed in such a way that an optical axis of said lens coincides with said light which is emitted from said junction, advances in the direction parallel to said principle surface, and passes through a part of said inclined end facet surface where is the nearest to said junction.

20. The light source device of claim 18, wherein said lens is disposed in such a way that an optical axis of said lens coincides with said light which is emitted from said junction via said inclined end facet surface and advances in a direction perpendicular to said inclined end facet surface.

* * * * *